United States Patent
You et al.

(10) Patent No.: US 12,245,170 B2
(45) Date of Patent: Mar. 4, 2025

(54) GAIN ADJUSTMENT CONTROL METHOD, DEVICE AND APPARATUS, AND COMPUTER READABLE STORAGE MEDIUM

(71) Applicant: ZTE Corporation, Shenzhen (CN)

(72) Inventors: Wei You, Shenzhen (CN); Jun Huang, Shenzhen (CN); Gang Li, Shenzhen (CN); Jun Li, Shenzhen (CN); Fei Xiang, Shenzhen (CN)

(73) Assignee: ZTE CORPORATION, Shenzhen (CN)

( * ) Notice: Subject to any disclaimer, the term of this patent is extended or adjusted under 35 U.S.C. 154(b) by 603 days.

(21) Appl. No.: 17/624,728

(22) PCT Filed: May 19, 2020

(86) PCT No.: PCT/CN2020/091034
§ 371 (c)(1),
(2) Date: Jan. 4, 2022

(87) PCT Pub. No.: WO2021/004164
PCT Pub. Date: Jan. 14, 2021

(65) Prior Publication Data
US 2022/0256482 A1     Aug. 11, 2022

(30) Foreign Application Priority Data

Jul. 5, 2019  (CN) .......................... 201910605821.0

(51) Int. Cl.
*H04W 52/52* (2009.01)
*H04W 52/02* (2009.01)
*H04W 52/36* (2009.01)

(52) U.S. Cl.
CPC ....... *H04W 52/52* (2013.01); *H04W 52/0245* (2013.01); *H04W 52/367* (2013.01)

(58) Field of Classification Search
CPC ............. H04W 52/52; H04W 52/0245; H04W 52/367
See application file for complete search history.

(56) References Cited

U.S. PATENT DOCUMENTS

| | | | |
|---|---|---|---|
| 8,948,611 | B1 | 2/2015 | Zocher et al. |
| 2006/0222118 | A1 | 10/2006 | Murthy et al. |

(Continued)

FOREIGN PATENT DOCUMENTS

| | | |
|---|---|---|
| CN | 102594275 A | 7/2012 |
| CN | 104703272 A | 6/2015 |

(Continued)

OTHER PUBLICATIONS

Japan Patent Office. Notice of Reasons for Refusal for JP Application No. 2022-500632 and English translation, mailed Jan. 30, 2023, pp. 1-6.

(Continued)

*Primary Examiner* — Justin Y Lee
(74) *Attorney, Agent, or Firm* — Vivacqua Crane, PLLC

(57) ABSTRACT

A gain adjustment control method, device and apparatus, and a non-transitory computer-readable storage medium are disclosed. The method may include: calculating energy of a full-bandwidth physical downlink shared channel (PDSCH) transmission signal in an intermediate frequency digital domain or a baseband digital domain according to a set calculation period; determining a gain control adjustment parameter according to the calculated energy of the full-bandwidth PDSCH transmission signal; and controlling and adjusting a gain of a receiver according to the determined gain control adjustment parameter and a gain adjustment rule.

18 Claims, 4 Drawing Sheets

(56) References Cited

U.S. PATENT DOCUMENTS

2013/0301428 A1* 11/2013 Weng .................. H04W 52/52
370/252
2013/0324065 A1 12/2013 Qin et al.

FOREIGN PATENT DOCUMENTS

| | | |
|---|---|---|
| CN | 106612533 A | 5/2017 |
| CN | 107086859 A | 8/2017 |
| EP | 2663140 A1 | 11/2013 |
| JP | 2008533876 A | 8/2008 |
| WO | 2018153043 A1 | 8/2018 |

OTHER PUBLICATIONS

International Searching Authority, International Search Report and Written Opinion for PCT Application No. PCT/CN2020/091034 and English translation, mailed Aug. 18, 2020, pp. 1-9.
Intellectual Property India. Examination Report for IN Application No. 202227003652 and English translation, mailed Jun. 17, 2022, pp. 1-7.
European Patent Office. Extended European Search Report for EP Application No. 20837132.8, mailed Aug. 3, 2022, pp. 1-7.
The State Intellectual Property Office of People's Republic of China. First Office Action for CN Application No. 2019106058210 and English translation, mailed Oct. 24, 2022, pp. 1-8.
The State Intellectual Property Office of People's Republic of China. First Search Report for CN Application No. 2019106058210 and English translation, mailed Oct. 12, 2022, pp. 1-4.

* cited by examiner

GAIN ADJUSTMENT CONTROL METHOD, DEVICE AND APPARATUS, AND COMPUTER READABLE STORAGE MEDIUM

CROSS-REFERENCE TO RELATED APPLICATION

This application is a national stage filing under 35 U.S.C. § 371 of international application number PCT/CN2020/091034, filed on May 19, 2020, which claims priority to Chinese patent application No. 201910605821.0 filed on Jul. 5, 2019. The contents of these applications are incorporated herein by reference in their entirety.

TECHNICAL FIELD

The embodiments of the present disclosure relate to the field of communication, in particular to a gain adjustment control method, device, apparatus and non-transitory computer-readable storage medium.

BACKGROUND

In a radio receiver system, the strength of received signals may vary greatly, and the receiver must be able to demodulate these signals with different strengths correctly. In the fifth generation mobile communication system, Orthogonal Frequency Division Multiplexing (OFDM) terminal receiver is used. When 256QAM modulation is used, there is a high peak-to-average ratio, and the gap between the peak and the trough of the signal is close to more than ten decibels, which is a wide range. A higher-order modulation is more sensitive. It's very difficult for a receiver with constant gain to correctly demodulate a signal with such a wide energy range. In order to demodulate signals with different strengths correctly, the gain must be automatically adjusted according to the signal strength, such that the terminal receiver still has a high gain when receiving a weak signal and a low gain when receiving a strong signal. This may require an automatic gain control loop. In existing technologies, an automatic gain control loop is implemented by medium radio frequency analog signal processing in the RF link. Because analog signal processing may be easily affected by interference and multi-path, especially after long-distance transmission, the influence of some random noise may become significant due to noise accumulation, which leads to demodulation failure. Especially for the application scenarios that require extremely high flatness of signals in time domain and frequency domain, such as the new 256QAM modulation and demodulation technology, it's difficult for a gain control method based on analog domain in existing technologies to meet the demand.

SUMMARY

A gain adjustment control method, device, apparatus and non-transitory computer-readable storage medium provided by the embodiments of the present disclosure can at least solve one of the technical problems in existing technologies to a certain extent, including providing a new gain adjustment control manner for the receiver, which can better meet the communication requirements.

An embodiment of the present disclosure provides a gain adjustment control method, which may include: calculating energy of a full-bandwidth physical downlink shared channel (PDSCH) transmission signal in an intermediate frequency digital domain or a baseband digital domain according to a set calculation period; determining a gain control adjustment parameter according to the calculated energy of the full-bandwidth PDSCH transmission signal; and controlling and adjusting a gain of a receiver according to the determined gain control adjustment parameter and a gain adjustment rule.

An embodiment of the present disclosure also provides a gain adjustment control device, which may include: an energy acquisition module, configured to calculate energy of a full-bandwidth physical downlink shared channel (PDSCH) transmission signal in an intermediate frequency digital domain or a baseband digital domain according to a set calculation period; and a gain control module, configured to determine a gain control adjustment parameter according to the energy of the full-bandwidth PDSCH transmission signal, and control and adjust a gain of a receiver according to the determined gain control adjustment parameter and a gain adjustment rule.

An embodiment of the present disclosure also provides a communication apparatus, which may include a processor, a memory and a communication bus, wherein the communication bus is configured to connect the processor and the memory; and the processor is configured to execute a computer program stored in the memory to implement the gain adjustment control method as described above.

An embodiment of the present disclosure also provides a non-transitory computer-readable storage medium storing one or more computer programs executable by one or more processors to implement the gain adjustment control method as described above.

Other features and corresponding beneficial effects of the present disclosure are explained in the subsequent description, and it should be understood that at least some of the beneficial effects become apparent from the description of the present disclosure.

DETAILED DESCRIPTION

In order to make the objective, technical schemes and advantages of the present disclosure clearly understood, the embodiments of the present disclosure will be further described in detail by means of several embodiments in conjunction with the accompanying drawings. It should be understood that the embodiments described here are intended only to explain the present disclosure and are not intended to limit the present disclosure.

Example Embodiment One

The gain adjustment control method provided by this embodiment can calculate the energy of the full-bandwidth physical downlink channel PDSCH transmission signal in the IF digital domain or the baseband digital domain according to the set calculation period, then determine the gain control adjustment parameters according to the energy of the full-bandwidth PDSCH transmission signal, and control the adjustment of the gain of the receiver according to the determined gain control adjustment parameters and gain adjustment rules. Compared with the existing technology, which realizes gain adjustment control based on medium radio frequency analog signal processing, this embodiment has better anti-interference performance and less influence from multi-path, and can better meet the application scenarios that require extremely high flatness of signals in time domain and frequency domain, such as the new 256QAM modulation and demodulation technology.

Figure 1:
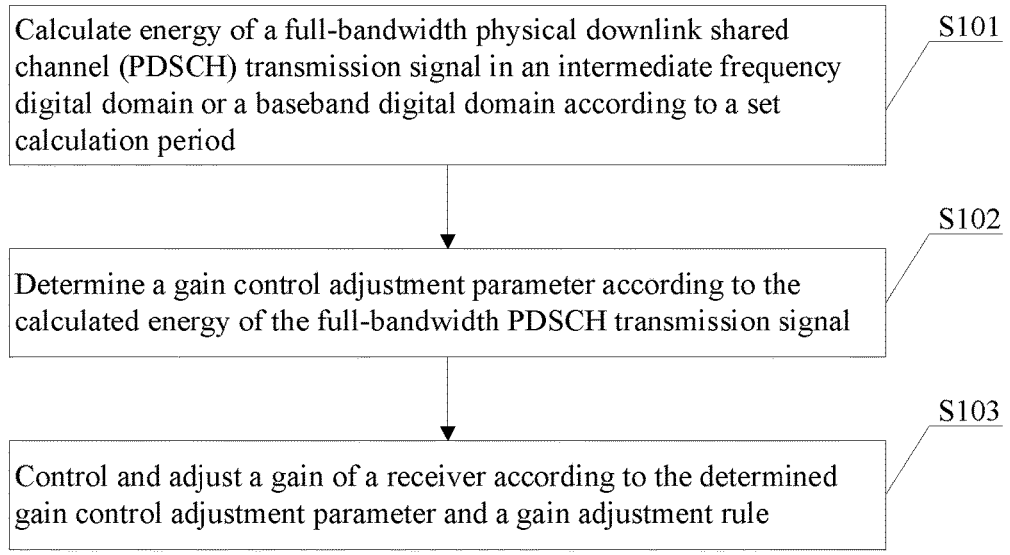
FIG. 1 is a flowchart a gain adjustment control method according to example embodiment one of the present disclosure.

A gain adjustment control method provided by this embodiment is shown in FIG. 1, which includes the following operations.

At S101, energy of a full-bandwidth physical downlink shared channel (PDSCH) transmission signal in an intermediate frequency digital domain or a baseband digital domain is calculated according to a set calculation period.

In this embodiment, a specific value of the calculation period can be flexibly set according to a specific application scenario. In this embodiment, the energy of the full-bandwidth PDSCH transmission signal may be calculated in the IF digital domain, or in the baseband digital domain, or be a combination of the energy of the full-bandwidth PDSCH transmission signal in the IF digital domain and the energy of the full-bandwidth PDSCH transmission signal in the baseband digital domain (for example, the energy of the full-bandwidth PDSCH transmission signal is calculated in the IF digital domain in some calculation periods, and the energy of the full-bandwidth PDSCH transmission signal is calculated in the baseband digital domain in other calculation periods). The calculation can be flexibly selected according to an application scenario.

At S102, a gain control adjustment parameter is determined according to the calculated energy of the full-bandwidth PDSCH transmission signal.

At S103, a gain of a receiver is controlled and adjusted according to the determined gain control adjustment parameter and a gain adjustment rule.

For the convenience of understanding, in an example of this embodiment, the energy of the full-bandwidth PDSCH transmission signal is calculated in the IF digital domain for automatic gain adjustment.

Figure 2:
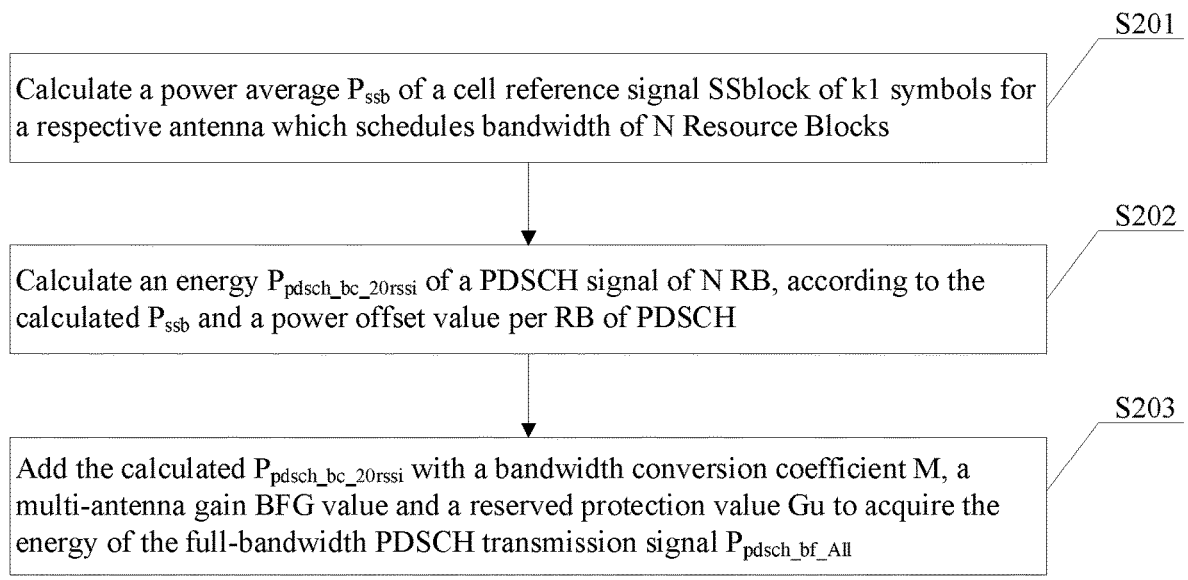
FIG. 2 is a flowchart of calculating the energy of the full bandwidth PDSCH transmission signal in the intermediate frequency (IF) digital domain according to example embodiment one of the present disclosure.

In this example, the process of calculating the energy of the full-bandwidth PDSCH transmission signal in the IF digital domain is shown in FIG. 2, which includes the following operations.

At S201, an average power $P_{ssb}$ of a cell reference signal SSblock of k1 symbols for each respective antenna which schedules bandwidth of N Resource Blocks (RB) is calculated, where k1 is an integer greater than or equal to 2. In an example, the value of k1 may be 4. Of course, other values can be flexibly selected according to the requirements.

At S202, according to the calculated $P_{ssb}$ and a power offset value per RB of PDSCH, energy $P_{pdsch\_bc\_20rssi}$ of a PDSCH signal of N RB is calculated.

At S203, the calculated $P_{pdsch\_bc\_20rssi}$ is added with a bandwidth conversion coefficient M, a multi-antenna gain BFG value and a reserved protection value Gu to acquire the energy of the full-bandwidth PDSCH transmission signal $P_{pdsch\_bf\_All}$, that is:

$$P_{pdsch\_bf\_All} = P_{pdsch\_bc\_20rssi} + M + BFG + Gu;$$

where, $M = 10*(\log_{10} 273 - \log_{10} X)$, the BFG value is a maximum power difference between the PDSCH signal and SSblock signal acquired on each antenna. The value of Gu may also be set flexibly according to requirements, for example, the value of Gu may be 3 db.

In this example, the process also includes: measuring a power $P_{csi\ rssi\_All}$ of a channel quality measurement reference signal (CSIRS) for a cell, for example, measuring a single symbol power of a CSIRS signal sent by a 5G cell at the terminal receiver and adding a prediction protection value; measuring a service symbol PDSCH signal power $P_{sym\ rssi\_All}$, for example, measuring a single symbol power of a CSIRS signal sent by a 5G cell at the terminal receiver and adding a prediction protection value.

In this example, if there is no PDSCH signal in a current calculation period, a BFG value in a previous calculation period with a PDSCH signal can be adopted, or a BFG value can be set to 0 or other preset values.

In some application scenarios, a currently adopted BFG value may also be time counted. If a duration t0 of the currently adopted BFG value is longer than a first preset duration T0, the currently adopted BFG value can be set as a preset BFG value, for example, preset to 0, or preset to other values as required.

In this example, the process of determining a gain control adjustment parameter according to the calculated energy of the full-bandwidth PDSCH transmission signal includes: selecting a largest one from the calculated $P_{pdsch\_bf\_All}$, $P_{csi\ rssi\_All}$ and $P_{sym\ rssi\_All}$ as the gain control adjustment parameter.

For the convenience of understanding, in an example of this embodiment, the energy of the full-bandwidth PDSCH transmission signal is calculated in the baseband digital domain for automatic gain adjustment.

Figure 3:
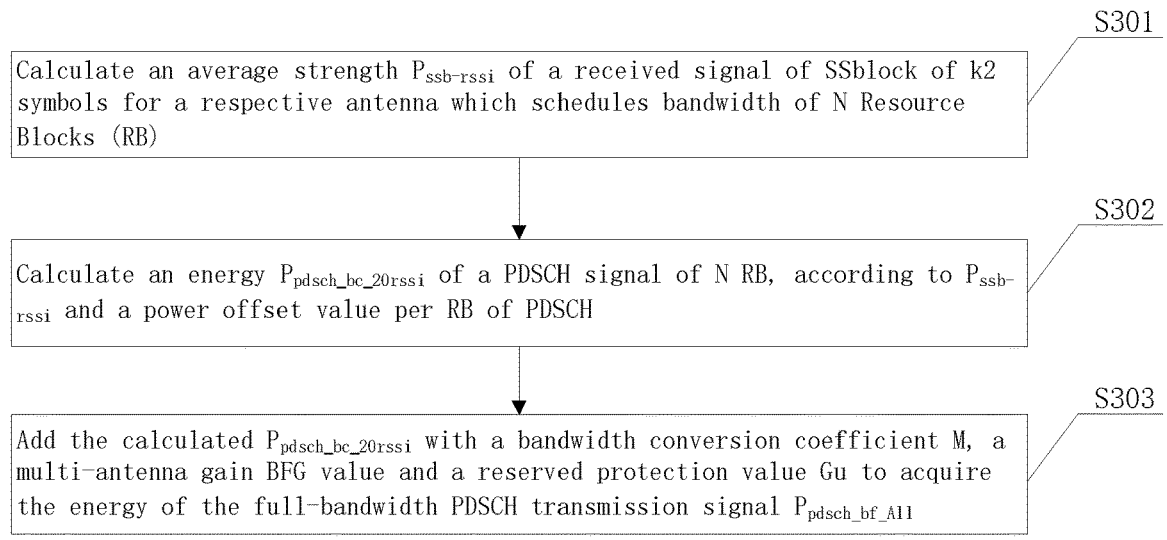
FIG. 3 is a flowchart of calculating the energy of the full bandwidth PDSCH transmission signal in the baseband digital domain according to example embodiment one of the present disclosure.

In this example, the process of calculating the energy of the full-bandwidth PDSCH transmission signal in the baseband digital domain is shown in FIG. 3, which includes the following operations.

At S301, an average strength $P_{ssb\text{-}rssi}$ of a received signal of SSblock of k2 symbols for each respective antenna which schedules bandwidth of N RB is calculated, where k2 is an integer greater than or equal to 2. In an example, the value of k2 may be 4. Of course, other values can be flexibly selected according to the requirements.

At S302, according to the calculated $P_{ssb\text{-}rssi}$ and a power offset value per RB of PDSCH, energy $P_{pdsch\_bc\_20rssi}$ of a PDSCH signal of N RB is calculated.

At S303, the calculated $P_{pdsch\_bc\_20rssi}$ is added with a bandwidth conversion coefficient M, a multi-antenna gain BFG value and a reserved protection value Gu to acquire the energy of the full-bandwidth PDSCH transmission signal $P_{pdsch\_bf\_All}$, that is:

$$P_{pdsch\_bf\_All}=P_{pdsch\_bc\_20rssi}+M+BFG+Gu;$$

where, $M=10*(\log_{10}273-\log_{10}X)$, the BFG value is a maximum power difference between the PDSCH signal and SSblock signal acquired on each antenna. The value of Gu may also be set flexibly according to requirements, for example, the value of Gu may be 3 db.

In this example, the BFG value in a previous calculation period with PDSCH signal may be adopted, and the BFG value may also be set to 0 or other preset values. In some application scenarios, a currently adopted BFG value may also be time counted. If a duration t0 of the currently adopted BFG value is longer than a first preset duration T0, the currently adopted BFG value can be set as a preset BFG value, for example, preset to 0, or preset to other values as required.

In this example, the process of determining a gain control adjustment parameter according to the calculated energy of the full-bandwidth PDSCH transmission signal includes: select a largest one from the calculated $P_{ssb\text{-}rssi}$, $P_{pdsch\_bc\_20rssi}$ and $P_{pdsch\_bf\_All}$ as the gain control adjustment parameter.

Figure 4:
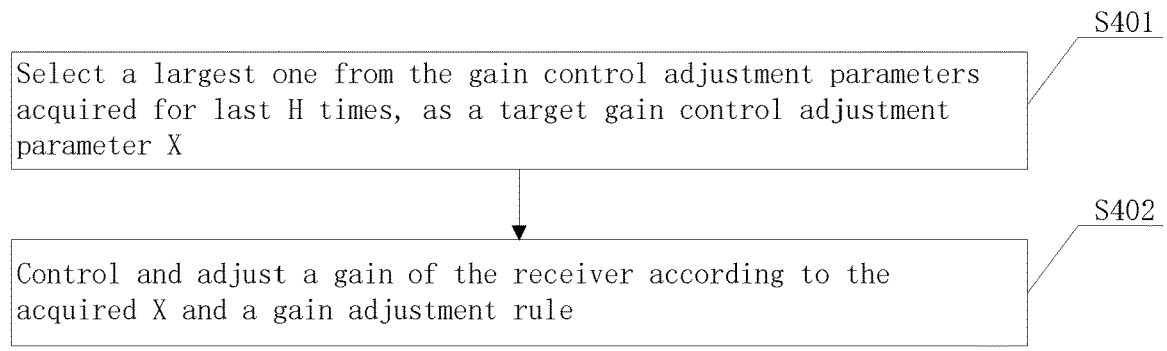
FIG. 4 is a schematic diagram of the gain control flow of example embodiment one of the present disclosure.

In this embodiment, after the gain control adjustment parameter is determined according to the above example implementations, the gain of the receiver is controlled to be adjusted according to the determined gain control adjustment parameter and gain adjustment rule, as shown in FIG. 4, which may include the following operations.

At S401, a largest gain control adjustment parameter is selected from the gain control adjustment parameters acquired for the last H times, as a target gain control adjustment parameter X.

H is an integer greater than or equal to 2, and it should be understood that a specific value of H may be flexibly set according to requirements, for example, it may be set to 2, 4, 8, 16, 32, 64, etc. In some examples, the acquired target gain control adjustment parameter X can be stored in a stack for a subsequent selection and calling.

And it should be understood that in some examples, the value of H may also be 1, that is, a gain control adjustment parameter acquired last time is directly used as the target gain control adjustment parameter.

At S402, a gain of the receiver is controlled and adjusted according to the acquired X and a gain adjustment rule.

For example, in some application scenarios, for anti-jitter, the receiver can be set to have L gain levels, the energy values of adjacent gain levels have an overlapping area, and L is an integer greater than or equal to 2.

In this application scenario, a preset gain adjustment rule may include, but are not limited to:
determining a target gain level according to the target gain control adjustment parameter X;
according to the target gain level acquired by a currently adopted gain level, switching a gain level.

In this application scenario, the process of determining the target gain level according to the target gain control adjustment parameter X may include, but is not limited to:
when the target gain control adjustment parameter X is located in an overlapping area of energy values of adjacent gain levels, and the currently adopted gain level is not in the adjacent gain level, determining that a lower gain level in the adjacent gain levels is the target gain level, based on a priority to a lower gain level; determining that the currently adopted gain level is the target gain level when the currently adopted gain level is in the adjacent gain level;
when the target gain control adjustment parameter X falls into a range of energy values of a certain gain level and is located outside the overlapping area of energy values, determining that a gain level where X falls into is the target gain level.

In this embodiment, the gain adjustment control method may also include, but is not limited to, at least one of the following.

In the second preset duration T1, when it is detected that the currently adopted gain level is switched to the target gain level for t1 times, and the target gain level is higher than the currently adopted gain level, the gain level after the last switch is locked in a preset locking time period. The specific locking duration may be flexibly set according to specific application scenarios.

In the third preset duration T2, when it is detected that the currently adopted gain level has not been switched, and there is a gain level lower than the currently adopted gain level, the currently adopted gain level is switched to a next gain level which is lower than the currently adopted gain level.

Figure 5:
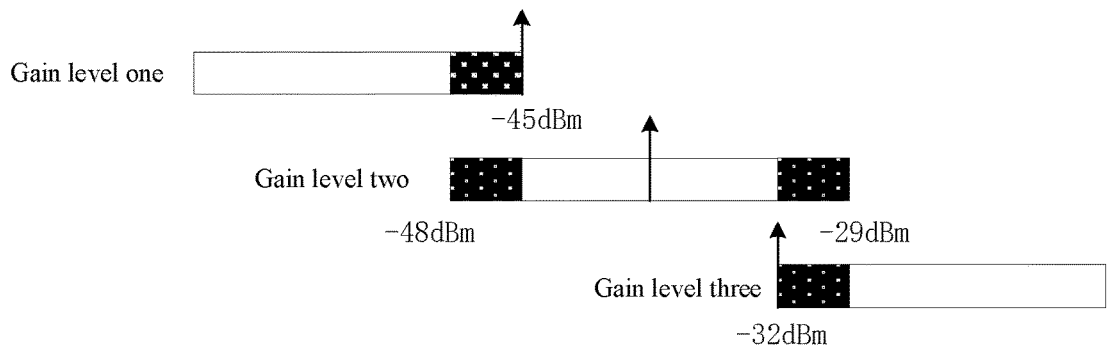
FIG. 5 is a schematic diagram of gain levels according to example embodiment one of the present disclosure.

For the convenience of understanding, this embodiment will be explained below by taking a terminal receiver in the 5G communication network as an example. Assuming that the terminal receiver has three gain levels, reference may be made to Table one as shown below and FIG. 5.

TABLE ONE

| Gain levels | Demarcation point |
| --- | --- |
| Gain level one | −45 dbm ≥ X |
| Gain level two | −29 dbm ≥ X ≥ −48 dbm |
| Gain level three | X ≥ −32 dbm |

In this example, a largest one is selected from the gain control adjustment parameters acquired for the last 8 times, as the target gain control adjustment parameter. In this example, for the switching control of the gain levels, a preference is applied to an adaptive change within a current gain level, and the current level will be switched only if it is beyond a gain level range thereof. The overall control is based on a priority order from lower to higher gain levels. For example, assuming that the target gain control adjustment parameter X selected for the first time is −47 dBm, it is determined that the currently adopted level is gain level one; assuming that the target gain control adjustment parameter X selected for the second time is −44 dBm, it is determined to switch from gain level one to gain level two; assuming that the target gain control adjustment parameter X selected for the third time is −47 dBm, it is determined to be still in gain level two; assuming that the target gain control adjustment parameter X selected for the fourth time is −50 dBm, the level is switched from gain level two to gain level one; assuming that the target gain control adjustment parameter X selected for the fifth time is −46 dBm, the level is kept as gain level one.

In this example, if there is no service signal PDSCH next time, i.e., there is no BFG, then BFG maintains the last value.

A counter t1 can be set to maintain a current level (that is, a gain level after the last switch is locked in a preset locking time period) if a number of upshift switching t1>T1 within a monitoring duration, and the locking time period is n*monitoring duration t, where n=1, 2, 3, 'n' may be used as a maintenance coefficient.

In this example, T1 is a threshold of a maximum number of upshifts, which is an adjustable value. In order to control a jitter effect caused by a upshift, 3 db overlap between levels and BFG maintenance mechanism may be applied, so as to achieve an anti-jitter effect.

In this embodiment, a counter t0 may also be set. For the currently adopted BFG, if t0>T0, the adopted BFG value is considered invalid and set to 0.

In this embodiment, a counter t2 may also be set. If t2>T2 and a reference value is always in a certain level, and there is a level lower than the current level, the level will be downshifted.

In this example, T0 and T2 are adjustable values, T0 is a fiducial time for BFG, and T1 is a time duration to maintain a current level. Therefore, the target level can be downshifted when there is no PDSCH, and a risk caused by an estimation deviation of an overlapping area can be reduced.

Example Embodiment Two

Figure 6:
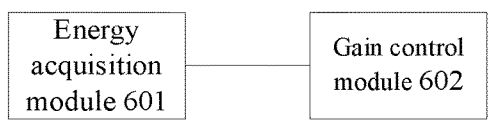
FIG. 6 is a structural diagram of a gain adjustment control device according to example embodiment two of the present disclosure.

This embodiment provides a gain adjustment control device, which can be arranged in various communication devices (such as a receiver). Reference is made to FIG. 6, which includes the following modules.

An energy acquisition module 601 is configured to calculate energy of a full-bandwidth physical downlink shared channel (PDSCH) transmission signal in an intermediate frequency digital domain or a baseband digital domain according to a set calculation period.

In this embodiment, a specific value of the calculation period can be flexibly set according to a specific application scenario. In this embodiment, the energy of the full-bandwidth PDSCH transmission signal may be calculated in the IF digital domain, or in the baseband digital domain, or be a combination of the energy of the full-bandwidth PDSCH transmission signal in the IF digital domain and the energy of the full-bandwidth PDSCH transmission signal in the baseband digital domain (for example, the energy of the full-bandwidth PDSCH transmission signal is calculated in the IF digital domain in some calculation periods, and the energy of the full-bandwidth PDSCH transmission signal is calculated in the baseband digital domain in other calculation periods). The calculation can be flexibly selected according to an application scenario.

A gain control module 602 is configured to determine a gain control adjustment parameter according to the energy of the full-bandwidth PDSCH transmission signal, and control and adjust a gain of a receiver according to the determined gain control adjustment parameter and a gain adjustment rule.

For the convenience of understanding, in an example of this embodiment, the energy of the full-bandwidth PDSCH transmission signal is calculated in the IF digital domain for automatic gain adjustment.

Figure 7:
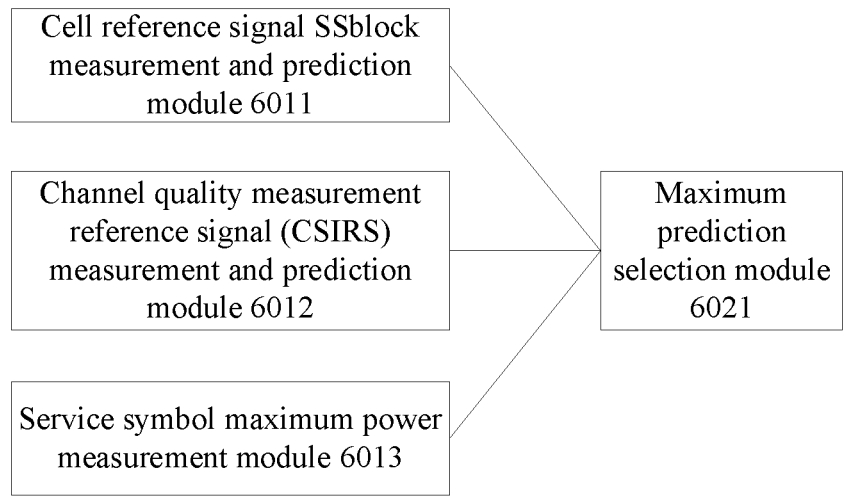
FIG. 7 is a schematic structural diagram of an energy acquisition module and a gain control module according to example embodiment two of the present disclosure.

In this example, as shown in FIG. 7, the energy acquisition module 601 includes a cell reference signal SSblock measurement and prediction module 6011, which is configured for the terminal receiver to predict a maximum single symbol power of SSblock reference signal and shaping gain in the intermediate frequency digital domain. An example cell reference signal SSblock measurement and prediction module 6011 is configured to perform the following calculation processes.

The cell reference signal SSblock measurement and prediction module 6011 is configured to calculate average power $P_{ssb}$ of a cell reference signal SSblock of k1 symbols for each respective antenna which schedules bandwidth of N Resource Blocks (RB); according to the calculated $P_{ssb}$ and a power offset value per RB of PDSCH, calculate energy $P_{pdsch\_bc\_20rssi}$ of a PDSCH signal of N RB; add the calculated $P_{pdsch\_bc\_20rssi}$ with a bandwidth conversion coefficient M, a multi-antenna gain BFG value and a reserved protection value Gu to acquire the energy of the full-bandwidth PDSCH transmission signal $P_{pdsch\_bf\_All}$, that is:

$$P_{pdsch\_bf\_All} = P_{pdsch\_bc\_20rssi} + M + BFG + Gu;$$

where k1 is an integer greater than or equal to 2. In an example, the value of k1 may be 4. where, M=10*($\log_{10}273 - \log_{10}X$), the BFG value is a maximum power difference between the PDSCH signal and SSblock signal acquired on each antenna. The value of Gu may also be set flexibly according to requirements, for example, the value of Gu may be 3 db.

In this example, the energy acquisition module 601 also includes a channel quality measurement reference signal (CSIRS) measurement and prediction module 6012 which is configured to measure a power $P_{csi\_rssi\_All}$ of a channel quality measurement reference signal (CSIRS) for a cell, for example, measuring a single symbol power of a CSIRS signal sent by a 5G cell at the terminal receiver and adding a prediction protection value.

The energy acquisition module 601 also includes a service symbol maximum power measurement module 6013, which is configured to measure a service symbol PDSCH signal power $P_{sym\_rssi\_All}$, for example, measuring a single symbol power of a CSIRS signal sent by a 5G cell at the terminal receiver and adding a prediction protection value.

In this example, if there is no PDSCH signal in a current calculation period, a BFG value in a previous calculation period with a PDSCH signal can be adopted, or a BFG value can be set to 0 or other preset values.

In some application scenarios, a currently adopted BFG value may also be time counted. If a duration t0 of the currently adopted BFG value is longer than a first preset duration T0, the currently adopted BFG value can be set as a preset BFG value, for example, preset to 0, or preset to other values as required.

The gain control module 602 also includes a maximum prediction selection module 6021, which is configured to select a largest one from the calculated $P_{pdsch\_bf\_All}$, $P_{csi\_rssi\_All}$ and $P_{sym\_rssi\_All}$ as the gain control adjustment parameter.

For the convenience of understanding, in an example of this embodiment, the energy of the full-bandwidth PDSCH transmission signal is calculated in the baseband digital domain for automatic gain adjustment.

Figure 8:
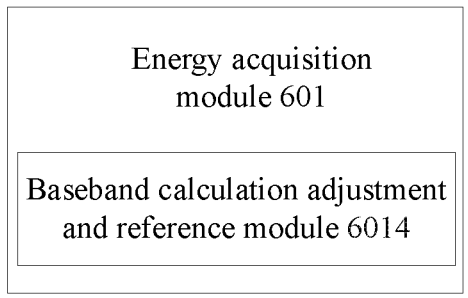
FIG. 8 is a schematic structural diagram of another energy acquisition module according to example embodiment two of the present disclosure.

In this example, as shown in FIG. 8, the energy acquisition module 601 includes a baseband calculation adjustment and reference module 6014, which is configured to calculate an average strength $P_{ssb-rssi}$ of a received signal of SSblock of k2 symbols for each respective antenna which schedules bandwidth of N RB; according to the calculated $P_{ssb-rssi}$ and a power offset value per RB of PDSCH, calculate energy $P_{pdsch\_bc\_20rssi}$ of a PDSCH signal of N RB; add the calculated $P_{pdsch\_bc\_20rssi}$ with a bandwidth conversion coefficient M, a multi-antenna gain BFG value and a reserved protection value Gu to acquire the energy of the full-bandwidth PDSCH transmission signal $P_{pdsch\_bf\_All}$, that is:

$$P_{pdsch\_bf\_All} = P_{pdsch\_bc\_20rssi} + M + BFG + Gu;$$

where k2 is an integer greater than or equal to 2. In an example, the, value of k2 may be 4. $M=10*(\log_{10}273-\log_{10}X)$, the BFG value is a maximum power difference between the PDSCH signal and SSblock signal acquired on each antenna. The value of Gu may also be set flexibly according to requirements, for example, the value of Gu may be 3 db.

In this example, the BFG value in a previous calculation period with PDSCH signal may be adopted, and the BFG value may also be set to 0 or other preset values. In some application scenarios, a currently adopted BFG value may also be time counted. If a duration t0 of the currently adopted BFG value is longer than a first preset duration T0, the currently adopted BFG value can be set as a preset BFG value, for example, preset to 0, or preset to other values as required.

In this example, the baseband calculation adjustment and reference module 6014 is configured to select a largest one from the calculated $P_{ssb-rssi}$, $P_{pdsch\_bc\_20rssi}$ and $P_{pdsch\_bf\_All}$ as the gain control adjustment parameter.

Figure 9:
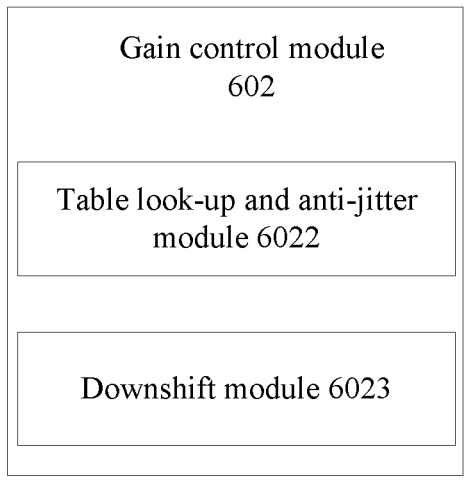
FIG. 9 is a schematic structural diagram of another gain control module according to example embodiment two of the present disclosure.

As shown in FIG. 9, the gain control module 602 in this embodiment also includes a table look-up and anti-jitter module 6022 and a downshift module 6023, where:

The anti-jitter module 6022 is configured to: select a largest one from the gain control adjustment parameters acquired for the last H times, as a target gain control adjustment parameter X; control and adjust a gain of the receiver according to the acquired X and a gain adjustment rule. H is an integer greater than or equal to 2, in some examples, the value of H may also be 1, that is, a gain control adjustment parameter acquired last time is directly used as the target gain control adjustment parameter.

For example, in some application scenarios, for anti-jitter, the receiver can be set to have L gain levels, the energy values of adjacent gain levels have an overlapping area, and L is an integer greater than or equal to 2.

In this application scenario, a preset gain adjustment rule may include, but are not limited to:
determining a target gain level according to the target gain control adjustment parameter X;
according to the target gain level acquired by a currently adopted gain level, switching a gain level.

In this application scenario, the process of determining the target gain level according to the target gain control adjustment parameter X may include, but is not limited to:
when the target gain control adjustment parameter X is located in the overlapping area of energy values of adjacent gain levels, and the currently adopted gain level is not in the adjacent gain level, determining that a lower gain level in the adjacent gain levels is the target gain level, based on a priority to a lower gain level; determining that the currently adopted gain level is the target gain level when the currently adopted gain level is in the adjacent gain level;
when the target gain control adjustment parameter X falls into a range of energy values of a certain gain level and is located outside the overlapping area of energy values, determining that a gain level where X falls into is the target gain level.

In this embodiment, the table lookup and anti-jitter module 6022 may also be configured to, in the second preset duration T1, when it is detected that the currently adopted gain level is switched to the target gain level for t1 times, and the target gain level is higher than the currently adopted gain level, lock the gain level after the last switch for a preset locking time period. The specific locking duration may be flexibly set according to specific application scenarios.

The downshift module 6023 may be configured to, in the third preset duration T2, when it is detected that the currently adopted gain level has not been switched, and there is a gain level lower than the currently adopted gain level, switch the currently adopted gain level to a next gain level which is lower than the currently adopted gain level.

The gain adjustment control device provided by this embodiment can calculate the energy of the full-bandwidth physical downlink channel PDSCH transmission signal in the IF digital domain or the baseband digital domain according to the set calculation period, then determine the gain control adjustment parameters according to the energy of the full-bandwidth PDSCH transmission signal, and control the adjustment of the gain of the receiver according to the determined gain control adjustment parameters and gain adjustment rules. This embodiment has better anti-interference performance and less influence from multi-path, and can better meet the application scenarios that require extremely high flatness of signals in time domain and frequency domain, such as the new 256QAM modulation and demodulation technology.

Example Embodiment Three

Figure 10:
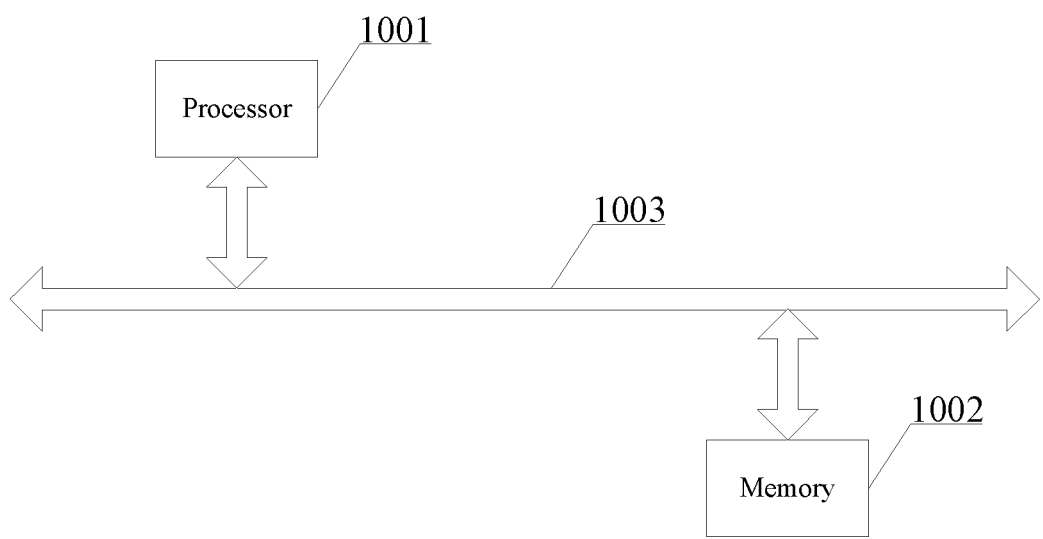
FIG. 10 is a structural diagram of a communication apparatus according to example embodiment three of the present disclosure.

This embodiment also provides a communication device, which can be used as various receivers, such as a terminal receiver in a 5G communication system. As shown in FIG. 10, the communication device includes a processor 1001, a memory 1002 and a communication bus 1003.

The communication bus 1003 is configured to implement a communication between the processor 1001 and the memory 1002.

In an example, the processor 1001 is configured to execute one or more computer program stored in the memory 1002 to implement the gain adjustment control methods of the above embodiments.

This embodiment further provides a computer-readable storage medium that includes a volatile or non-volatile, removable or non-removable medium implemented in any method or technology for storing information (such as computer-readable instructions, data structures, computer program modules, or other data). The computer-readable storage media include, but are not limited to, random access memory (RAM), read-only memory (ROM), electrically erasable programmable read-only memory (EEPROM), flash memory or other memory technologies, compact disc read-only memory (CD-ROM), digital versatile disc (DVD) or other optical disc storage, cassettes, magnetic tapes, magnetic disc storage or other magnetic storage devices, or any other media that can be configured to store desired information and can be accessed by a computer.

In an example, the computer-readable storage medium in this embodiment may be configured to store one or more computer programs executable by one or more processors to implement the gain adjustment control methods of the above embodiments.

This embodiment further provides a computer program (or computer software), which may be distributed on a computer-readable medium and may be executed by a computing device to implement at least one step of the gain adjustment control methods of the above embodiments. In some cases, at least one of the steps shown or described may be performed in a different order from that described in the above embodiments.

This embodiment further provides a computer program product including a computer-readable device on which a computer program as described above is stored. In this embodiment, the computer-readable device may include the non-transitory computer-readable storage medium as described above.

The gain adjustment control method, device, apparatus and non-transitory computer-readable storage medium provided by this embodiment can calculate the energy of the full-bandwidth physical downlink channel (PDSCH) transmission signal in the IF digital domain or the baseband digital domain according to the set calculation period, then determine the gain control adjustment parameters according to the energy of the full-bandwidth PDSCH transmission signal, and control the adjustment of the gain of the receiver. Compared with the existing technology, which realizes gain adjustment control based on medium radio frequency analog signal processing, this embodiment has better anti-interference performance and less influence from multi-path, and can better meet the application scenarios that require extremely high flatness of signals in time domain and frequency domain.

As can be seen, it should be understood by those having ordinary skills in the art that all or some of the steps in the methods disclosed above, functional modules/units in the systems and devices disclosed above may be implemented as software (which may be implemented by computer program code executable by a computing device), firmware, hardware, and appropriate combinations thereof. In the hardware implementation, the division between functional modules/units mentioned in the above description does not necessarily correspond to the division of physical components; for example, a physical component may have multiple functions, or a function or step may be performed cooperatively by several physical components. Some or all of the physical components may be implemented as software executed by a processor, such as a central processing unit, a digital signal processor or a microprocessor, or as hardware, or as an integrated circuit, such as an application specific integrated circuit.

Furthermore, it is well known to those having ordinary skills in the art that communication media typically contain computer-readable instructions, data structures, computer program modules or other data in a modulated data signal such as a carrier wave or other transmission mechanism, and may include any information delivery media. Therefore, the present disclosure is not limited to any particular combination of hardware and software.

The foregoing is a detailed description of the embodiments of the present disclosure in conjunction with particular implementations, and specific implementations of the present disclosure should not be construed as being limited to the description. For those having ordinary skills in the art to which the present disclosure pertains, without departing from the concept of the present disclosure, several deductions or substitutions can be made, which should be regarded as falling within the scope of the present disclosure.

The invention claimed is:

1. A gain adjustment control method, comprising:
calculating energy of a full-bandwidth physical downlink shared channel (PDSCH) transmission signal in an intermediate frequency digital domain or a baseband digital domain according to a set calculation period;
determining a gain control adjustment parameter according to the calculated energy of the full-bandwidth PDSCH transmission signal; and
controlling and adjusting a gain of a receiver according to the determined gain control adjustment parameter and a gain adjustment rule;
wherein controlling and adjusting the gain of a receiver according to the determined gain control adjustment parameter and the gain adjustment rule comprises:
selecting a largest one from gain control adjustment parameters acquired for last H times, as a target gain control adjustment parameter X; and
controlling and adjusting a gain of the receiver according to the target gain control adjustment parameter X and a gain adjustment rule.

2. The gain adjustment control method of claim 1, wherein calculating the energy of the full-bandwidth PDSCH transmission signal in the intermediate frequency digital domain comprises:
calculating average power $P_{ssb}$ of a cell reference signal SSblock of k1 symbols for a respective antenna which schedules bandwidth of N Resource Blocks (RB), where k1 is an integer greater than or equal to 2;
calculating energy $P_{pdsch\_bc\_20rssi}$ of a PDSCH signal of N RB, according to the $P_{ssb}$ and a power offset value per RB of PDSCH; and
adding $P_{pdsch\_bc\_20rssi}$ with a bandwidth conversion coefficient M, a multi-antenna gain BFG value and a reserved protection value Gu to acquire the energy of the full-bandwidth PDSCH transmission signal $P_{pdsch\_bf\_All}$, where $M=10*(\log_{10}273-\log_{10}X)$, the BFG value is a maximum power difference between the PDSCH signal and SSblock signal acquired on the respective antenna.

3. The gain adjustment control method of claim 2, further comprising:
measuring a power $P_{csi\ rssi\_All}$ of a channel quality measurement reference signal (CSIRS) for a cell, and measuring a service symbol PDSCH signal power $P_{sym\ rssi\_All}$; and
determining a gain control adjustment parameter according to the energy of the full-bandwidth PDSCH transmission signal comprising:
selecting a largest one from $P_{pdsch\_bf\_All}$, $P_{csi\ rssi\_All}$ and $P_{sym\ rssi\_All}$ as the gain control adjustment parameter.

4. A non-transitory computer-readable storage medium storing at least one computer program executable by at least one processor to implement the gain adjustment control method of claim 3.

5. The gain adjustment control method of claim 2, wherein the value Gu is 3 db.

6. A non-transitory computer-readable storage medium storing at least one computer program executable by at least one processor to implement the gain adjustment control method of claim 5.

7. The gain adjustment control method of claim 2, wherein,
in response to an absence of PDSCH signal in a current calculation period, a BFG value in a previous calculation period which involving a PDSCH signal is adopted; and
in response to a duration of a currently adopted BFG value being longer than a first preset duration, the currently adopted BFG value is set as a preset BFG value.

8. A non-transitory computer-readable storage medium storing at least one computer program executable by at least one processor to implement the gain adjustment control method of claim 7.

9. A non-transitory computer-readable storage medium storing at least one computer program executable by at least one processor to implement the gain adjustment control method of claim 2.

10. The gain adjustment control method of claim 1, wherein calculating the energy of the full-bandwidth PDSCH transmission signal in the baseband digital domain comprises:
 calculating an average strength $P_{ssb\text{-}rssi}$ of a received signal of SSblock of k2 symbols for a respective antenna which schedules bandwidth of N RB, where k1 is an integer greater than or equal to 2;
 calculating energy $P_{pdsch\_bc\_20rssi}$ of a PDSCH signal of N RB, according to $P_{ssb\text{-}rssi}$ and a power offset value per RB of PDSCH; and
 adding $P_{pdsch\_be\_20rssi}$ with a bandwidth conversion coefficient M, a multi-antenna gain BFG value and a reserved protection value Gu to acquire the energy of the full-bandwidth PDSCH transmission signal $P_{pdsch\_bf\_All}$.

11. The gain adjustment control method of claim 10, wherein determining a gain control adjustment parameter according to the energy of the full-bandwidth PDSCH transmission signal comprises:
 selecting a largest one from $P_{ssb\text{-}rssi}$, $P_{pdsch\_bc\_20rssi}$ and $P_{pdsch\_bf\_All}$ as the gain control adjustment parameter.

12. A non-transitory computer-readable storage medium storing at least one computer program executable by at least one processor to implement the gain adjustment control method of claim 11.

13. A non-transitory computer-readable storage medium storing at least one computer program executable by at least one processor to implement the gain adjustment control method of claim 10.

14. The gain adjustment control method of claim 1, wherein,
 the receiver has L gain levels, energy values of adjacent gain levels have an overlapping area, and L is an integer greater than or equal to 2; and
 the gain adjustment rule comprises:
 determining a target gain level according to the target gain control adjustment parameter X; and
 switching a gain level, according to the target gain level and the currently adopted gain level;
 wherein determining a target gain level according to the target gain control adjustment parameter X comprises:
 when the target gain control adjustment parameter X is located in the overlapping area of energy values of adjacent gain levels, and the currently adopted gain level is not in the adjacent gain levels, determining that a lower gain level in the adjacent gain levels is the target gain level; when the currently adopted gain level is in the adjacent gain levels, determining that the currently adopted gain level is the target gain level; and
 when the target gain control adjustment parameter X falls into a range of energy values of a certain gain level and is located outside the overlapping area of energy values, determining that a gain level where X falls into is the target gain level.

15. The gain adjustment control method of claim 14, further comprising at least one of:
 in a second preset duration, in response to a detection that the currently adopted gain level is switched to the target gain level for t1 times, and the target gain level is higher than the currently adopted gain level, locking the gain level after a last switching within a preset locking time period; and
 in a third preset duration, in response to a detection that the currently adopted gain level has not been switched, and there is a gain level lower than the currently adopted gain level, switching the currently adopted gain level to a next gain level which is lower than the currently adopted gain level.

16. A non-transitory computer-readable storage medium storing at least one computer program executable by at least one processor to implement the gain adjustment control method of claim 1.

17. A gain adjustment control device, comprising:
 an energy acquisition module, configured to calculate energy of a full-bandwidth physical downlink shared channel (PDSCH) transmission signal in an intermediate frequency digital domain or a baseband digital domain according to a set calculation period; and
 a gain control module, configured to determine a gain control adjustment parameter according to the energy of the full-bandwidth PDSCH transmission signal, and control and adjust a gain of a receiver according to the determined gain control adjustment parameter and a gain adjustment rule;
 wherein, in order to control and adjust the gain of the receiver according to the determined gain control adjustment parameter and the gain adjustment rule the gain control module is further configured to:
 select a largest one from gain control adjustment parameters acquired for last H times, as a target gain control adjustment parameter X; and
 control and adjust a gain of the receiver according to the target gain control adjustment parameter X and a gain adjustment rule.

18. A communication apparatus, comprising:
 a memory storing a computer program;
 a processor, configured to execute the computer program to implement the gain adjustment control method comprising:
 calculating energy of a full-bandwidth physical downlink shared channel (PDSCH) transmission signal in an intermediate frequency digital domain or a baseband digital domain according to a set calculation period;
 determining a gain control adjustment parameter according to the calculated energy of the full-bandwidth PDSCH transmission signal; and
 controlling and adjusting a gain of a receiver according to the determined gain control adjustment parameter and a gain adjustment rule;
 wherein controlling and adjusting the gain of the receiver according to the determined gain control adjustment parameter and the gain adjustment rule comprises:
 selecting a largest one from gain control adjustment parameters acquired for last H times, as a target gain control adjustment parameter X; and
 controlling and adjusting a gain of the receiver according to the target gain control adjustment parameter X and a gain adjustment rule;
 and
 a communication bus, configured to connect the processor and the memory.

* * * * *